US008847647B1

(12) United States Patent
Buckler

(10) Patent No.: US 8,847,647 B1
(45) Date of Patent: Sep. 30, 2014

(54) SYNCHRONIZER CIRCUITS WITH FAILURE-CONDITION DETECTION AND CORRECTION

(71) Applicant: Advanced Micro Devices, Inc., Sunnyvale, CA (US)

(72) Inventor: Mark Buckler, Acton, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/024,396

(22) Filed: Sep. 11, 2013

(51) Int. Cl.
H03L 7/00 (2006.01)
H03K 3/356 (2006.01)

(52) U.S. Cl.
CPC .............. *H03K 3/356008* (2013.01)
USPC ........................................................ 327/161

(58) Field of Classification Search
CPC ......... H03L 7/0814; G06F 1/10; H03K 5/135
USPC ..................... 327/161, 261, 263, 264, 231
See application file for complete search history.

(56) References Cited

U.S. PATENT DOCUMENTS

| 5,053,767 | A  | * | 10/1991 | Zweifel et al. | 340/968 |
|---|---|---|---|---|---|
| 7,746,108 | B1 | * | 6/2010 | Young et al. | 326/39 |
| 7,746,112 | B1 | * | 6/2010 | Gaide et al. | 326/41 |
| 7,982,496 | B1 | * | 7/2011 | Young | 326/38 |
| 8,706,793 | B1 | * | 4/2014 | Young | 708/620 |
| 8,732,639 | B1 | * | 5/2014 | Fung et al. | 716/108 |
| 2007/0255974 | A1 | * | 11/2007 | Gilday et al. | 713/503 |
| 2011/0063931 | A1 | * | 3/2011 | Linam et al. | 365/193 |
| 2013/0216013 | A1 | * | 8/2013 | Dally et al. | 375/355 |
| 2013/0314134 | A1 | * | 11/2013 | Kulmala et al. | 327/155 |
| 2014/0062555 | A1 | * | 3/2014 | Osborn et al. | 327/160 |
| 2014/0132245 | A1 | * | 5/2014 | Dally et al. | 324/76.82 |

OTHER PUBLICATIONS

Clifford E. Cummings et al., "Synchronous Resets? Asynchronous Resets? I am so confused! How will I ever know which to use?", SNUG, San Jose, 31 pages, 2002. http://www.sunburst-design.com/papers/CummingsSNUG2002SJ_Resets.pdf.
Neil H.E. Weste et al., "CMOS VLSI Design: A Circuits and Systems Perspective", Pearson Education, Inc., publishing as Addison-Wesley, Section 1.4.9 (pp. 16-19), Section 10.3 (pp. 391-402), Section 10.6 (411-420), 2011.
William J. Dally et al., "The Even/Odd Synchronizer: A Fast, All-Digital Periodic Synchronizer", 2010 IEEE Symposium on Asynchronous Circuits and Systems (ASYNC), pp. 75-84, May 2010.
Charles Dike et al., "Miller and Noise Effects in a Synchronizing Flip-Flop", IEEE Journal of Solid-State Circuits, vol. 34, No. 6, pp. 849-855, Jun. 1999.

(Continued)

*Primary Examiner* — Adam Houston
(74) *Attorney, Agent, or Firm* — Mahamedi Paradice LLP

(57) ABSTRACT

An input signal and a reset signal are provided to respective inputs of a resettable flip-flop. The resettable flip-flop generates an output signal. The output signal transitions from a first logic state to a second logic state in response to corresponding transitions of the input signal and transitions from the second logic state to the first logic state in response to assertion of the reset signal. A warning signal is asserted in response to transitions of the input signal from the second logic state to the first logic state. A logic gate forwards the output signal when the warning signal is de-asserted and provides a signal in the first logic state in response to assertion of the warning signal.

20 Claims, 7 Drawing Sheets

(56) References Cited

OTHER PUBLICATIONS

Ran Ginosar, "Metastability and Synchronizers: A Tutorial", Design and Test of Computers, IEEE, vol. 28, No. 5, pp. 23-35, Sep.-Oct. 2011.

Jun Zhou et al., "On-Chip Measurement of Deep Metastability in Synchronizers", IEEE Journal of Solid-State Circuits, vol. 43, No. 2, pp. 550-557, Feb. 2008.

Jennifer Stephenson et al., "Understanding Metastability in FPGAs", Altera, 6 pages, 2009. http://www.altera.com/literature/wp/wp-01082-quartus-ii-metastability.pdf.

* cited by examiner

US 8,847,647 B1

SYNCHRONIZER CIRCUITS WITH FAILURE-CONDITION DETECTION AND CORRECTION

STATEMENT OF GOVERNMENT INTEREST

This invention was made with Government support under Prime Contract Number DE-AC52-07NA27344, Subcontract Number B600716 awarded by DOE. The Government has certain rights in this invention.

TECHNICAL FIELD

The present embodiments relate generally to synchronizer circuits, and more specifically to mitigation of metastability in synchronizer circuits.

BACKGROUND

Synchronizer circuits are used to transition data between different clock domains in an electronic device. For example, a Multiple Clock Domain (MCD) device may use synchronizer circuits to transition data between respective clock domains. An example of an MCD device is a Globally Asynchronous Locally Synchronous (GALS) System on a Chip (SoC), in which different parts of the chip operate at different frequencies, yet communicate with each other. Another example is a processor in which high-clock-rate processor cores communicate with slower cores and/or even slower memory. Still other examples are possible.

Synchronizer circuits suffer from metastability. When a clock of a receiving clock domain rises while data in a data line between a transmitting clock domain and a synchronizer circuit in the receiving clock domain is transitioning, a metastable state may potentially be generated. The metastable state causes an output value of neither high nor low, effectively corrupting the data and causing any logic after the synchronizer circuit in the receiving clock domain to produce incorrect results.

SUMMARY OF ONE OR MORE EMBODIMENTS

In some embodiments, a synchronizer circuit includes a resettable flip-flop with a data input to receive an input signal, a reset input to receive a reset signal, and a data output to provide an output signal. The resettable flip-flop produces transitions of the output signal from a first logic state to a second logic state in response to corresponding transitions of the input signal and produces transitions in the output signal from the second logic state to the first logic state in response to assertion of the reset signal. The synchronizer circuit also includes a detector circuit to assert a warning signal in response to transitions of the input signal from the second logic state to the first logic state. The synchronizer circuit further includes a logic gate to forward the output signal when the warning signal is de-asserted and to provide a signal in the first logic state in response to assertion of the warning signal.

In some embodiments, a method of data synchronization includes providing an input signal and a reset signal to respective inputs of a resettable flip-flop. The resettable flip-flop generates an output signal. The output signal transitions from a first logic state to a second logic state in response to corresponding transitions of the input signal and transitions from the second logic state to the first logic state in response to assertion of the reset signal. A warning signal is asserted in response to transitions of the input signal from the second logic state to the first logic state. A logic gate forwards the output signal when the warning signal is de-asserted and provides a signal in the first logic state in response to assertion of the warning signal.

BRIEF DESCRIPTION OF THE DRAWINGS

The present embodiments are illustrated by way of example and are not intended to be limited by the figures of the accompanying drawings.

Like reference numerals refer to corresponding parts throughout the figures and specification.

DETAILED DESCRIPTION

Reference will now be made in detail to various embodiments, examples of which are illustrated in the accompanying drawings. In the following detailed description, numerous specific details are set forth in order to provide a thorough understanding of the disclosure. However, some embodiments may be practiced without these specific details. In other instances, well-known methods, procedures, components, and circuits have not been described in detail so as not to unnecessarily obscure aspects of the embodiments.

A synchronizer circuit may include one or more resettable flip-flops in accordance with some embodiments. As the term is used herein, a resettable flip-flop includes a data input, clock input, reset input, and data output. Resettable flip-flops thus are distinguishable from D flip-flops, which include data inputs, clock inputs, and data outputs, but do not include reset inputs. Also, a resettable flip-flop as the term is used herein is configured to provide an output signal from its data output that transitions from a first logic state to a second logic state in response to corresponding transitions of an input signal applied to its data input, but does not transition from the second logic state to the first logic state in response to corresponding transitions of the input signal. Instead, the output signal transitions from the second logic state to the first logic state in response to assertion of the reset signal.

Figure 1:
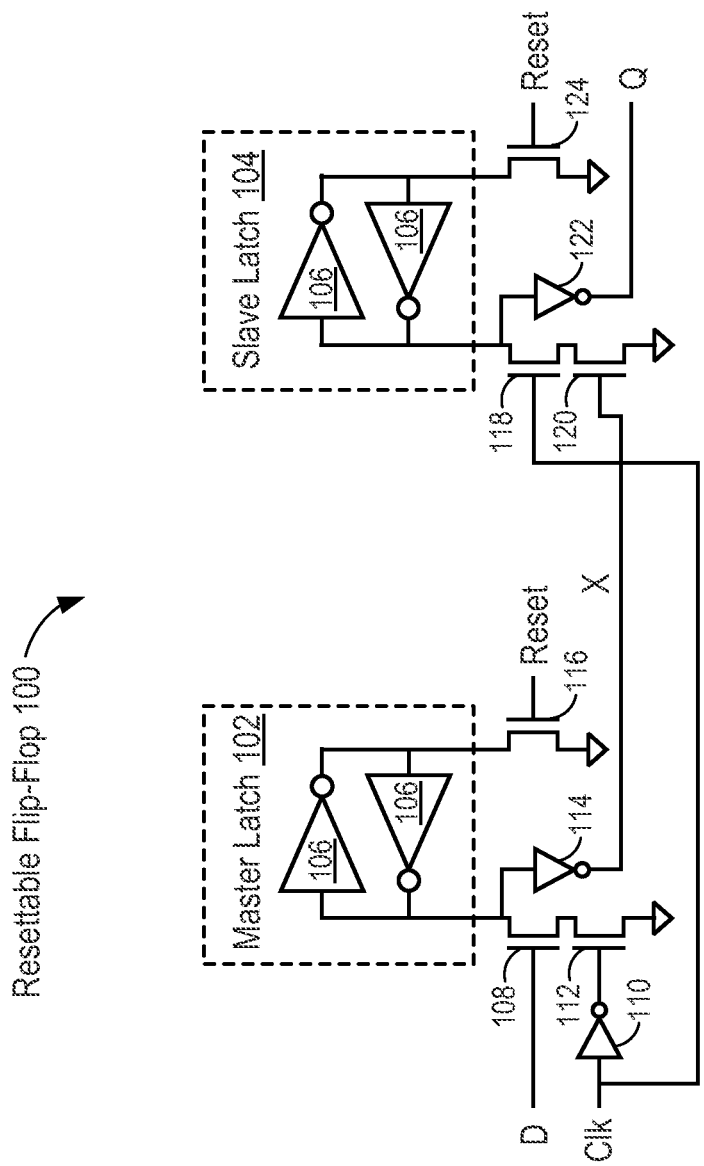
FIG. 1 is a circuit diagram of a resettable flip-flop.

FIG. 1 is a circuit diagram of a resettable flip-flop 100. The resettable flip-flop 100 is one example of a resettable flip-flop; other examples are possible. The resettable flip-flop 100 includes a master latch 102 and a slave latch 104, each of which includes a pair of cross-coupled inverters 106. The gate of a transistor 108 serves as the data input and receives an input signal ("D"). An input of an inverter 110 receives a clock signal ("clk"). The output of the inverter 110 is provided to a gate of a transistor 112. The transistors 108 and 112 are arranged in series between the left side of the master latch 102 and ground. When the data signal is in a logic-high state (i.e., '1') and the clock signal is in a logic-low state (i.e., '0'), the transistors 108 and 112 both turn on and couple the left side of the master latch 102 to ground, thereby driving the left side of the master latch 102 to '0.' (The transistors 108 and 112, as well as transistors 116, 118, 120, and 124, are n-type metal-oxide-semiconductor (NMOS) field effect transistors (FETs), or n-FETs.) Coupling the left side of the master latch 102 to ground drives the right side of the master latch 102 to '1', due to the cross-coupled arrangement of the inverters 106. As a result, a '1' is stored in the master latch 102. (In this example, the value of the right side of each latch 102 and 104 is considered to be the value stored in the latch.) A transition of the input signal from '1' to '0', however, causes the transistor 108 to turn off and therefore does not change the value stored in the master latch 102.

An inverter 114 provides the value ("X") stored in the master latch 102 to the gate of the transistor 120. The input clock is provided to the gate of the transistor 118. (The input of the inverter 110 and the gate of the transistor 118 compose the clock input of the resettable flip-flop 100). The transistors 118 and 120 are arranged in series between the left side of the slave latch 104 and ground. When the value of the master latch 102 is '1' and the clock is asserted, the transistors 118 and 120 both turn on and couple the left side of the slave latch 104 to ground. Coupling the left side of the slave latch 104 to ground drives the right side of the slave latch 104 to '1', due to the cross-coupled arrangement of the inverters 106. As a result, a '1' is stored in the slave latch 104. A transition of the value stored in the master latch 102 from '1' to '0', however, causes the transistor 120 to turn off and therefore does not change the value stored in the slave latch 104.

A transistor 116 is coupled between the right side of the master latch 102 and ground. A transistor 124 is coupled between the right side of the slave latch 104 and ground. The gates of the transistors 116 and 124 receive a reset signal and thus compose the reset input of the resettable flip-flop 100. When the reset signal is asserted, the transistor 116 couples the right side of the master latch 102 to ground, causing a '0' to be stored in the master latch 102 (assuming the transistors 108 and 112 are not also on at the same time). Similarly, the transistor 124 couples the right side of the slave latch 104 to ground when the reset signal is asserted, causing a '0' to be stored in the slave latch 104 (assuming the transistors 118 and 120 are not also on at the same time). As a result, the output signal provided by the inverter 122 becomes '0'; if it was already '0', it stays '0'. In this manner, the reset signal resets the resettable flip-flop 100.

An inverter 122 coupled to the left side of the slave latch 104 provides the value stored in the slave latch 104 as the output signal ("Q") of the resettable flip-flop 100. The output of the inverter 122 thus is the data output of the resettable flip-flop 100.

As the above description indicates, the output signal of the resettable flip-flop 100 transitions from a logic-low state to a logic-high state in response to transitions of the input signal from the logic-low state to the logic-high state, assuming appropriate clocking. The output signal of the resettable flip-flop 100, however, does not transition from the logic-high state to the logic-low state in response to transitions of the input signal from the logic-high state to the logic-low state. Instead, the output signal of the resettable flip-flop 100 transitions from the logic-high state to the logic-low state in response to assertion of the reset signal. Therefore, in the example of the resettable flip-flop 100, the first logic state (as the term is used in the above definition of a resettable flip-flop) is a logic-low state and the second logic state (as the term is used in the above definition of a resettable flip-flop) is a logic-high state. The resettable flip-flop 100 is merely one example of a resettable flip-flop in which the first logic state is a logic-low state and the second logic state is a logic-high state; other examples are possible.

Also, a resettable flip-flop may be designed such that the first logic state is a logic-high state and the second logic state is a logic-low state. For example, the resettable flip-flop 100 may be modified by switching the position of the transistors 108 and 112 with the position of the transistor 116 and also switching the position of the transistors 118 and 120 with the position of the transistor 124. Each of the transistors 108, 112, 116, 118, 120, and 124 would still receive the respective signals shown in FIG. 1. The transistors 116 and 124 thus would be respectively coupled to the inverters 114 and 122. The transistor 116, when turned on, would pull down the left side of the master latch 102, and the transistors 108 and 112, when both turned on, would pull down the right side of the master latch 102. Likewise, the transistor 124, when turned on, would pull down the left side of the slave latch 104, and the transistors 118 and 120, when both turned on, would pull down the right side of the slave latch 104.

Resettable flip-flops such as the resettable flip-flop 100 are desirable for use in synchronizer circuits because they have low input capacitance. The data input of the resettable flip-flop 100 corresponds to the gate of a single transistor 108, resulting in a low input capacitance. This low input capacitance results in a low minimum steady time for the resettable flip-flop 100, where the minimum steady time is the sum of the setup time and hold time for the resettable flip-flop 100. A low minimum steady time reduces the likelihood of metastability and thus reduces the mean time between failures caused by metastability.

Figure 2:
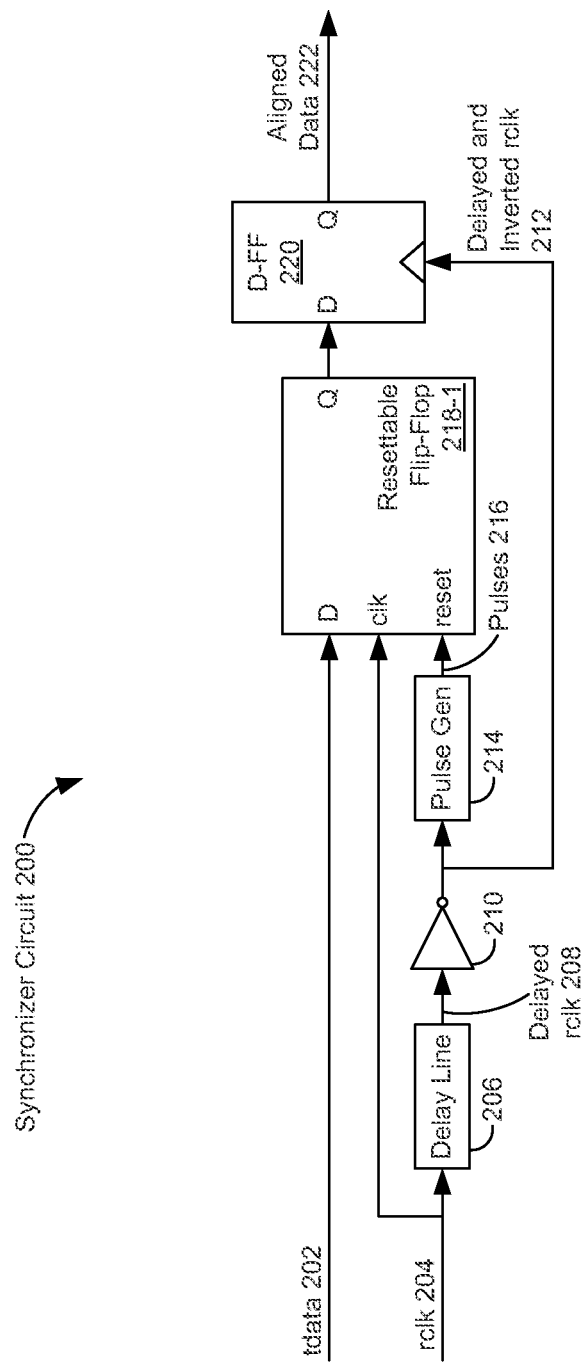
FIG. 2 is a circuit diagram of a synchronizer circuit that includes a resettable flip-flop in accordance with some embodiments.

FIG. 2 is a circuit diagram of a synchronizer circuit 200 that includes a resettable flip-flop 218-1 in accordance with some embodiments. The resettable flip-flop 218-1 may be implemented using the resettable flip-flop 100 or another resettable flip-flop design. The synchronizer circuit 200 is used to transition data from a first clock domain to a second clock domain. In some embodiments, the synchronizer circuit 200 is implemented in a first-in-first-out buffer (FIFO) that performs this transition function.

The synchronizer circuit 200 receives transmit data ("tdata") 200 from the first clock domain as an input signal. A receive clock ("rclk") 204 is generated in the second clock domain and provided to the synchronizer circuit 200. The receive clock 204 is said to be a local clock, since it is generated in the second clock domain, which is the clock domain receiving the transmit data 202. The transmit data 202 is provided to a data input ("D") of the resettable flip-flop 218-1. The receive clock 204 is provided to a clock input ("clk") of the resettable flip-flop 218-1.

A delay line 206, inverter 210, and pulse generator 214 are arranged in series, such that the output of the pulse generator 214 is coupled to a reset input of the resettable flip-flop 218-1. The delay line 206 delays the receive clock 204, thereby producing a delayed receive clock 208. The inverter 210 inverts the delayed receive clock 208, thereby producing a delayed, inverted receive clock 212. The pulse generator 214 generates pulses 216 based on the delayed, inverted receive clock 212. The pulses 216 are provided to the reset input of the resettable flip-flop 218-1 as a receive signal.

A data output ("Q") of the resettable flip-flop 218-1 is coupled to a data input of a D flip-flop 220. The delayed, inverted receive clock 212 is provided to a clock input of the D flip-flop 220. The D flip-flop 220 thus samples an output signal from the resettable flip-flop 218-1 in accordance with the delayed, inverted receive clock 212 and outputs aligned data 222. The aligned data 222 is said to be aligned because it is aligned with the clocking for the second clock domain.

Figure 3:
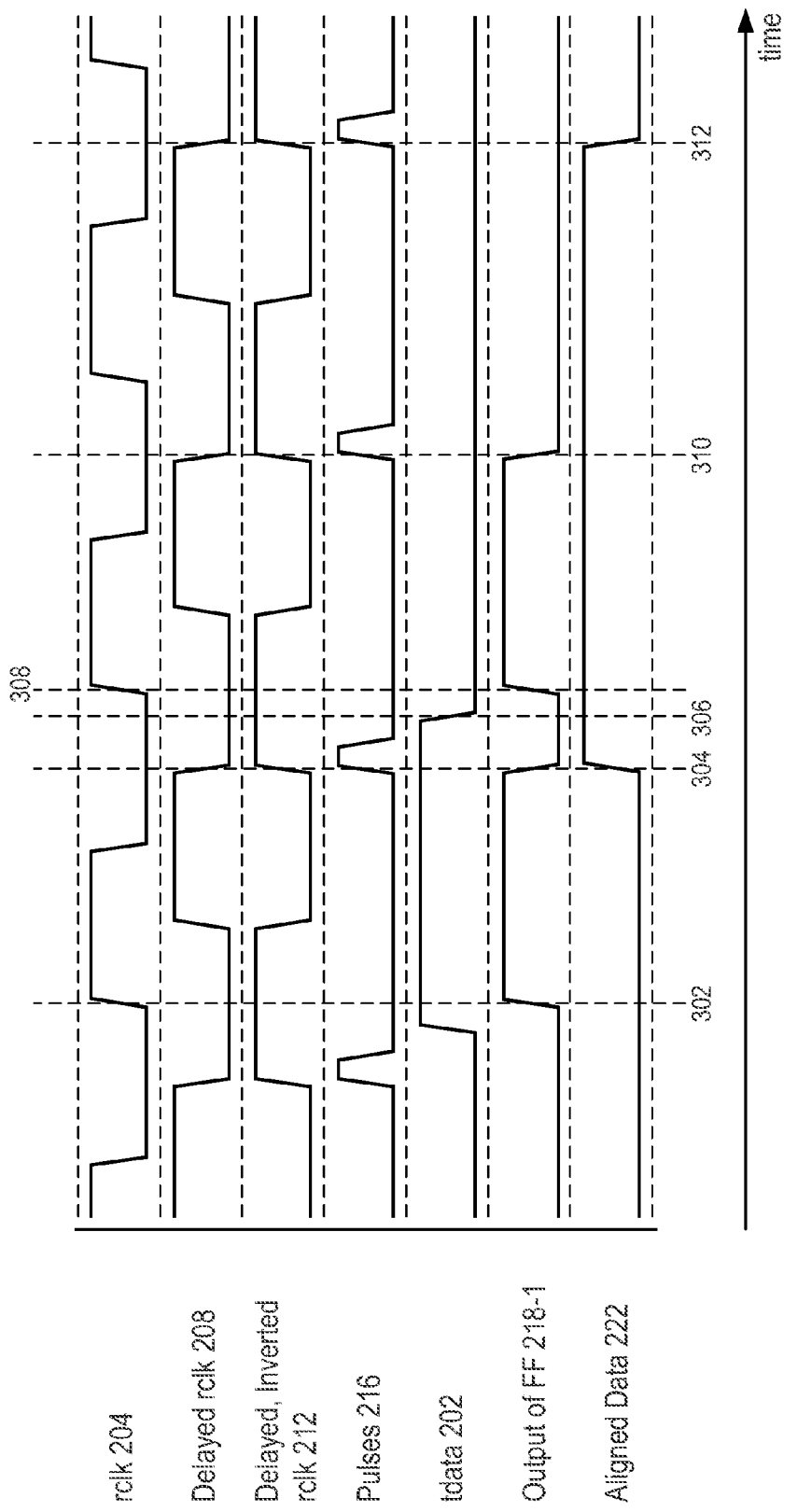
FIG. 3 is a timing diagram associated with operation of the synchronizer circuit of FIG. 2 in accordance with some embodiments.

FIG. 3 is a timing diagram associated with operation of the synchronizer circuit 200 (FIG. 2) in accordance with some embodiments. A rising edge of the receive clock 204 occurs at a time 302. At a point in the clock cycle preceding time 302, the transmit data 202 transitions from '0' to '1'. At time 302, the resettable flip-flop 218-1 samples the '1' from the transmit data 202. As a result, the output of the resettable flip-flop 218-1 transitions from '0' to '1' at time 302.

A rising edge of the delayed, inverted receive clock 212, which clocks the D flip-flop 220, occurs at a time 304 within the clock cycle that follows the rising edge of the receive clock 204 at time 302. The D flip-flop 220 therefore samples the '1' from the resettable flip-flop 218-1 at time 304, and the aligned data 222 transitions from '0' to '1' at time 304. This transition of the aligned data 222 corresponds to the '0' to '1' transition (i.e., low-to-high transition) of the transmit data 202 that occurs in the clock cycle before time 302. This transition of the aligned data 222 occurs within one clock cycle after the rising edge of the receive clock 204 at time 302.

The pulse generator 214 produces a pulse 216 that begins at time 304, in response to the rising edge of the delayed, inverted receive clock 212. (The pulse 216 actually begins slightly after time 304, due to a delay associated with the pulse generator 214. This delay, combined with the hold time of the resettable flip-flop 218-1, allows the D flip-flop 220 to sample the '1' output by the resettable flip-flop 218-1 before the output signal from the resettable flip-flop 218-1 transitions from '1' to '0'.) The pulse 216 at time 304 causes the output of the resettable flip-flop 218-1 to transition from '1' to '0' as shown. For example, if the resettable flip-flop 218-1 is a resettable flip-flop 100 (FIG. 1), the pulse 216 at time 304 turns on the transistor 124 at a time when the transistor 118 is off (because the receive clock 204 is low, as FIG. 3 shows). As a result, a '0' is stored in the slave latch 104, and the output of the resettable flip-flop 218-1 transitions from '1' to '0' at (or slightly after) time 304.

However, the pulse 216 at time 304 occurs while the transmit data 202 is '1'. The transmit data 202 does not transition from '1' to '0' until time 306, at which time the pulse 216 has ended. As a result, the output of the resettable flip-flop 218-1 transitions back to '1' when the rising edge of the receive clock 204 occurs at time 308.

For example, if the resettable flip-flop 218-1 is a resettable flip-flop 100 (FIG. 1), the pulse 216 at time 304 turns on the transistor 116 at a time when the transistors 108 and 112 are also on. As a result, the '1' stored in the master latch 102 is not reset. Instead, the master latch 102 continues to store a '1' and provides this '1' to the slave latch 104, and thus to the output of the resettable flip-flop 100, upon the rising edge of the receive clock 204 at time 308.

The output of the resettable flip-flop 218-1 remains '1' until the next pulse 216 occurs at time 310, in response to which the output of the resettable flip-flop 218-1 transitions back to '0'. The D flip-flop 220 samples this '0' upon the next rising edge of the delayed, inverted receive clock 204, at time 312, and the aligned data 222 transitions from '1' to '0' at time 312 accordingly. This transition of the aligned data 222 corresponds to the transition of the transmit data 202 at time 306. However, this transition of the aligned data 222 occurs more than one clock cycle after the rising edge of the receive clock 204 at time 308 that follows the transition of the transmit data 202 at time 306.

FIG. 3 shows that the synchronizer circuit 200 (FIG. 2) has variable latency. The transition of the aligned data 222 from '0' to '1' at time 304 occurs within one clock cycle of the rising edge of the receive clock 204 at time 302 that follows the initial transition of the transmit data 202 from '0' to '1'. However, the transition of the aligned data 222 from '1' to '0' at time 312 occurs more than one clock cycle after the rising edge of the receive clock 204 at time 308 that follows the transition of the transmit data 202 from '1' to '0' at time 306. The synchronizer circuit 200 thus has single-cycle latency for low-to-high transitions but two-cycle latency for high-to-low transitions. This variable latency may cause errors in circuitry downstream from the synchronizer circuit 200 in the second clock domain.

Figure 4:
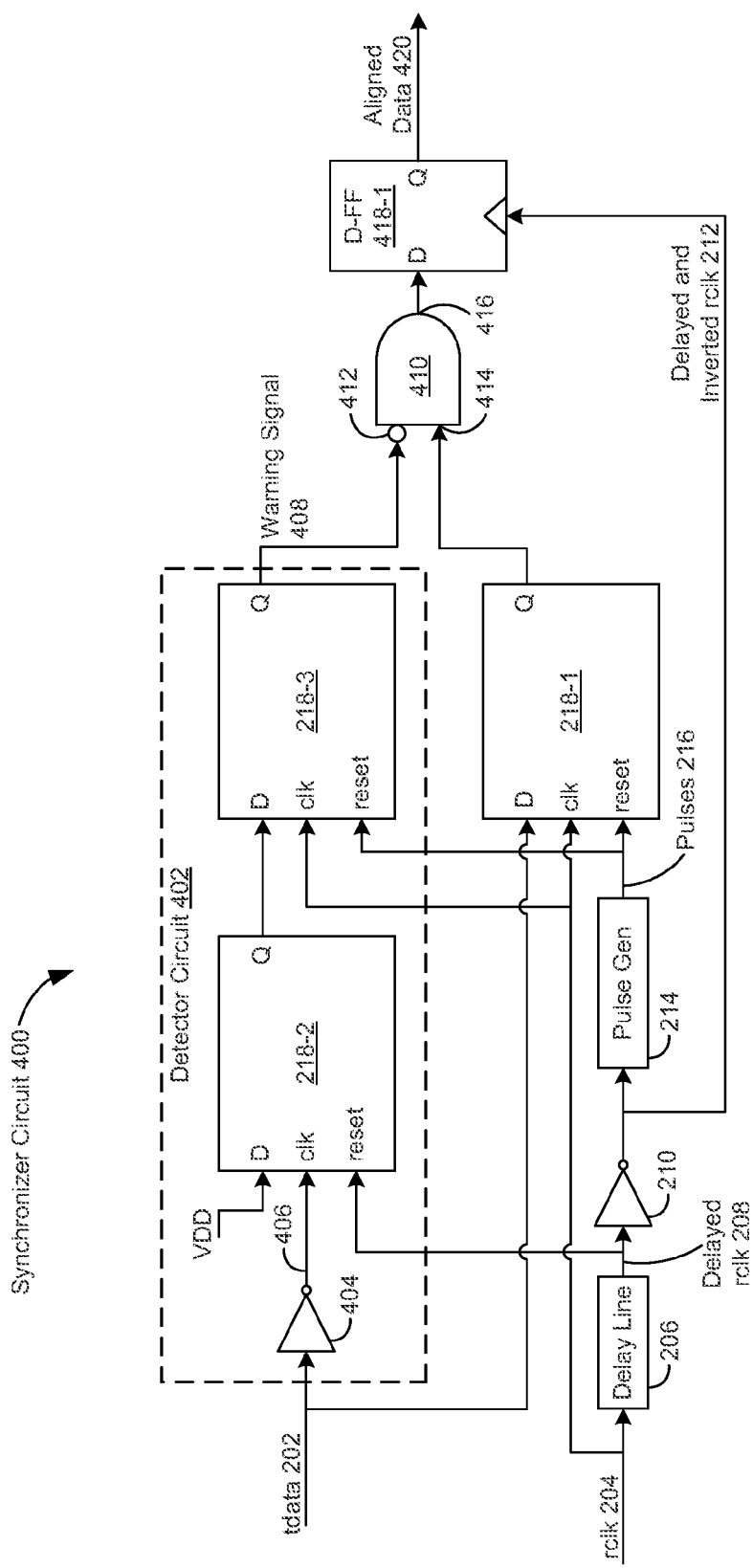
FIG. 4 is a circuit diagram of a synchronizer circuit with multiple resettable flip-flops in accordance with some embodiments.

FIG. 4 is a circuit diagram of a synchronizer circuit 400 that avoids the variable latency of the synchronizer circuit 200 (FIG. 2) in accordance with some embodiments. The synchronizer circuit 400 includes three resettable flip-flops 218-1, 218-2, and 218-3, which may be implemented using resettable flip-flops 100 or other resettable flip-flop designs. The synchronizer circuit 400 is used to transition data from a first clock domain to a second clock domain. In some embodiments, the synchronizer circuit 400 is implemented in a FIFO that performs this transition function.

The synchronizer circuit 400 includes a delay line 206, inverter 210, pulse generator 214, and first resettable flip-flop 218-1 arranged as described for the synchronizer circuit 200 (FIG. 2). The synchronizer circuit 400 also includes a detector circuit 402, AND gate 410, and D flip-flop 418-1. The detector circuit 402 detects '1' to '0' transitions (i.e., transitions from a logic-high state to a logic-low state, which are also referred to as high-to-low transitions) and asserts a warning signal 408 in response to the detected '1' to '0' transitions.

Transmit data 202 that either remains in the same state or transitions from '0' to '1' (or more generally, from the first state to the second state) may be referred to as monotonic data. Transmit data 202 that transitions from '1' to '0' (or more generally, from the second state to the first state) may be referred to as non-monotonic data. The extended latency of the synchronizer circuit 200 (FIG. 2), as shown in FIG. 3, is associated with non-monotonic data. The warning signal 408, when asserted, indicates the presence of non-monotonic data in the transmit data 202.

The warning signal 408 is provided to an inverting first input 412 of the AND gate 410. (Alternatively, an inverter coupled between the third resettable flip-flop 218-3 and the AND gate 410 inverts the warning signal 408 and provides the inverted warning signal to the AND gate 410. This inverter may be considered part of the detector circuit 402 or a separate component of the synchronizer circuit 400.) An output signal from the data output of the first resettable flip-flop 218-1 is provided to a non-inverting second input 414 of the AND gate 410. An output 416 of the AND gate 410 is coupled to a data input of the D flip-flop 418-1, which receives the delayed, inverted receive clock 212 at its clock input. The data output of the D flip-flop 418-1 provides aligned data 420.

Assertion of the warning signal 408 forces the output 416 of the AND gate 410 low, which in turn forces the aligned data 420 to a logic-low state. Since the warning signal 408 is asserted in response to '1' to '0' transitions, the aligned data 420 is forced low in response to '1' to '0' transitions, in a manner that avoids the extended latency associated with '1' to '0' transitions in the synchronizer circuit 200. When the warning signal 408 is de-asserted, the AND gate 410 passes the output signal from the data output of the first resettable flip-flop 218-1 through to the data input of the D flip-flip 418-1.

The detector circuit 402 includes an inverter 404, the second resettable flip-flop 218-2, and the third resettable flip-flop 218-3. The inverter 404 receives the transmit data 202 and provides inverted transmit data 406. The second resettable flip-flop 218-2 has a data input connected to a power supply (VDD), a clock input that receives the inverted transmit data 406, and a reset input that receives the delayed receive clock 208. Connecting the data input of the resettable flip-flop 218-2 to VDD effectively provides a signal fixed in a logic-high state to the data input. The third resettable flip-flop 218-3 has a data input coupled to the data output of the second resettable flip-flop 218-2, a clock input that receives the receive clock 204, and a reset input that receives the pulses 216. The data output of the third resettable flip-flop 218-3 provides the warning signal 408.

In operation, applying the delayed receive clock 208 to the reset input of the second resettable flip-flop 218-2 ensures that the data output of the second resettable flip-flop 218-2, and thus also the data output of the third resettable flip-flop 218-3, provides a '0' unless a '1' to '0' transition occurs for the transmit data 202. A '1' to '0' transition for the transmit data 202 results in a rising edge on the inverted transmit data 404, which causes the second resettable flip-flop 218-2 to sample the '1' provided by VDD. The output signal provided by the data output of the resettable flip-flop 218-2 transitions from '0' to '1' accordingly, which in turn causes the third resettable flip-flop 218-3 to transition the warning signal 408 from '0' to '1', thereby asserting the warning signal 408. (While the warning signal 408 is considered to be asserted when high in this example, in some embodiments a detector circuit 402 may be designed such that the warning signal 408 is considered to be asserted when low.)

In some embodiments, the inverter 404 is omitted, resulting in a detector circuit that inserts a warning signal in response to low-to-high transitions instead of high-to-low transitions. Such a detector circuit could be used in a synchronizer circuit in which the first resettable flip-flop 218-1 is replaced with a resettable flip-flop for which the first logic state is a logic-high state and the second logic state is a logic-low state.

Figure 5:
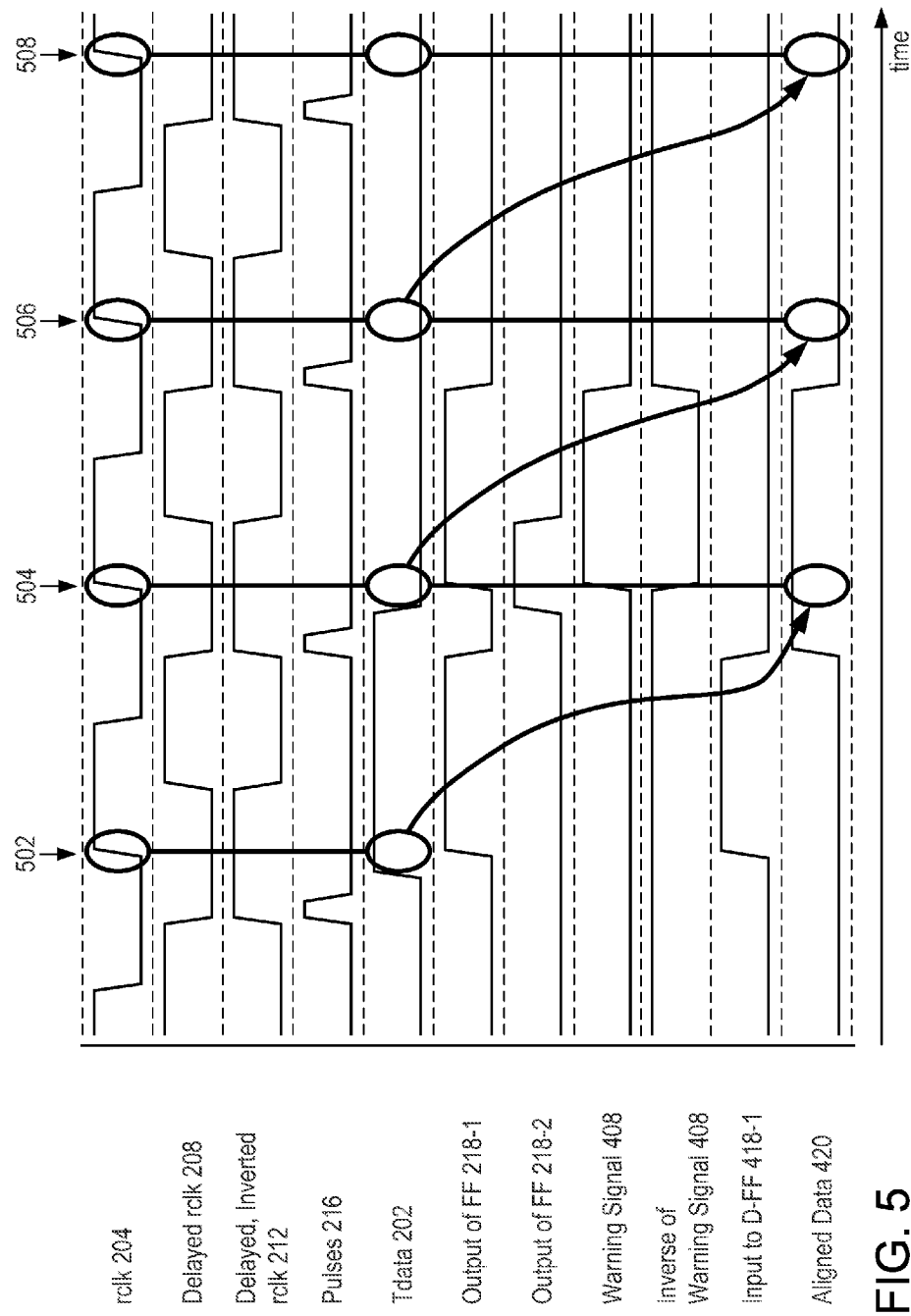
FIG. 5 is a timing diagram associated with operation of the synchronizer circuit of FIG. 4 in accordance with some embodiments.

FIG. 5 is a timing diagram associated with operation of the synchronizer circuit of FIG. 4 in accordance with some embodiments. In FIG. 5, waveforms for the receive clock 204; delayed receive clock 208; delayed, inverted receive clock 212; pulses 216; transmit data 202; and output of the first resettable flip-flop 218-1 are the same as in FIG. 3.

A '0' to '1' transition of the transmit data 202 occurs near the end of the clock cycle that precedes time 502. The transmit data 202 thus is '1' at time 502. The first resettable flip-flop 218-1 samples this '1' and its output transitions from '0' to '1' accordingly. The warning signal 408 is '0' (and remains '0' throughout the clock cycle from time 502 to time 504). As a result, the AND gate forwards a '1' to the D flip-flop 418-1, and the aligned data 420 transitions from '0' to '1' before the beginning of the next clock cycle at time 504. The synchronizer circuit 400 therefore has a latency of a single clock cycle for a '0' to '1' transition: the aligned data 420 transitions by time 504, one clock cycle after the time 502 at which the first resettable flip-flop 218-1 samples the '1' for the transmit data 202.

A '1' to '0' transition of the transmit data 202 occurs near the end of the clock cycle between times 502 and 504. This transition does not affect the output of the first flip-flop 218-1, as described with respect to FIG. 3, but causes the output of the second flip-flop 218-2 to transition from '0' to '1'. As a result, the warning signal 408 is asserted at time 504. The inverse of the warning signal 408 becomes '0', driving the output of the AND gate 410, and thus the input of the D flip-flop 418-1, to '0'. The aligned data 420 therefore goes low upon the next rising edge of the delayed, inverted receive clock 212, before time 506. The synchronizer circuit therefore has a latency of a single clock cycle for a '1' to '0' transition: the aligned data 420 has transitioned from '1' to '0' by time 506, one clock cycle after the time 504 at which the first resettable flip-flop 218-1 sampled the '0' for the transmit data 202.

In short, the values of the aligned data 420 at times 504, 506, and 508 equal the values of the transmit data 202 at times 502, 504, and 506, respectively, as shown by the curved arrows in FIG. 5. The synchronizer circuit 400 therefore consistently provides single-cycle latency.

In some embodiments, additional stages may be added to a synchronizer circuit such as the synchronizer circuit 400. Additional stages further reduce the likelihood of metastability, and thus reduce the mean time between failures caused by metastability.

Figure 6:
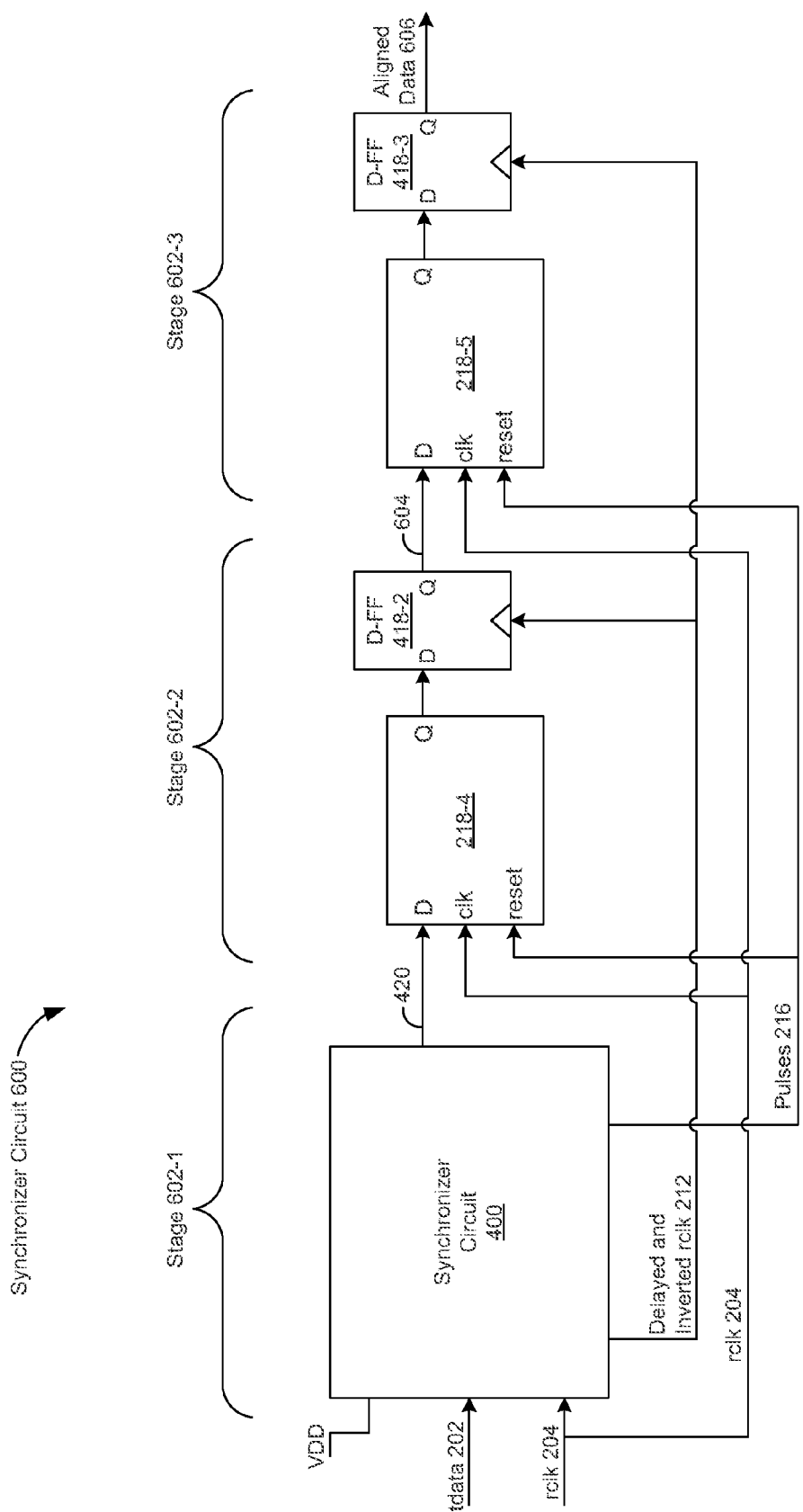
FIG. 6 is a block diagram of a multi-stage synchronizer circuit in accordance with some embodiments.

FIG. 6 is a block diagram of a multi-stage synchronizer circuit 600 in accordance with some embodiments. The synchronizer circuit 400 (FIG. 4) serves as a first stage 602-1 of the synchronizer circuit 600. Second and third stages 602-2 and 602-3 each include a resettable flip-flop in series with a D flip-flop: the second stage 602-2 includes a resettable flip-flop 218-4 in series with a D flip-flop 418-2, and the third stage 602-3 includes a resettable flip-flop 218-5 in series with a D flip-flop 418-3. The receive clock 204 is provided to clock inputs of the resettable flip-flops 218-4 and 218-5. The pulses 216 are provided to reset inputs of the resettable flip-flops 218-4 and 218-5. The delayed, inverted receive clock 212 is provided to clock inputs of the D flip-flops 418-2 and 418-3. The aligned data 420, which serves as an output signal for the first stage 602-1, is provided to the data input of the resettable flip-flop 218-4. The data output of the resettable flip-flop 218-4 is coupled to the data input of the D flip-flop 418-2. The data output of the D flip-flop 418-2 provides an output signal 604 that serves as an output signal for the second stage 602-2. This arrangement is repeated for the third stage 602-3, with the output signal 604 being provided to the data input of the resettable flip-flop 218-5 and the data output of the D flip-flop 418-3 providing aligned data 606. The aligned data 606 is the output of the synchronizer circuit 600.

While the synchronizer circuit 600 includes two additional stages 602-2 and 602-3, in other embodiments a synchronizer circuit may include one additional stage or more than two additional stages.

Figure 7:
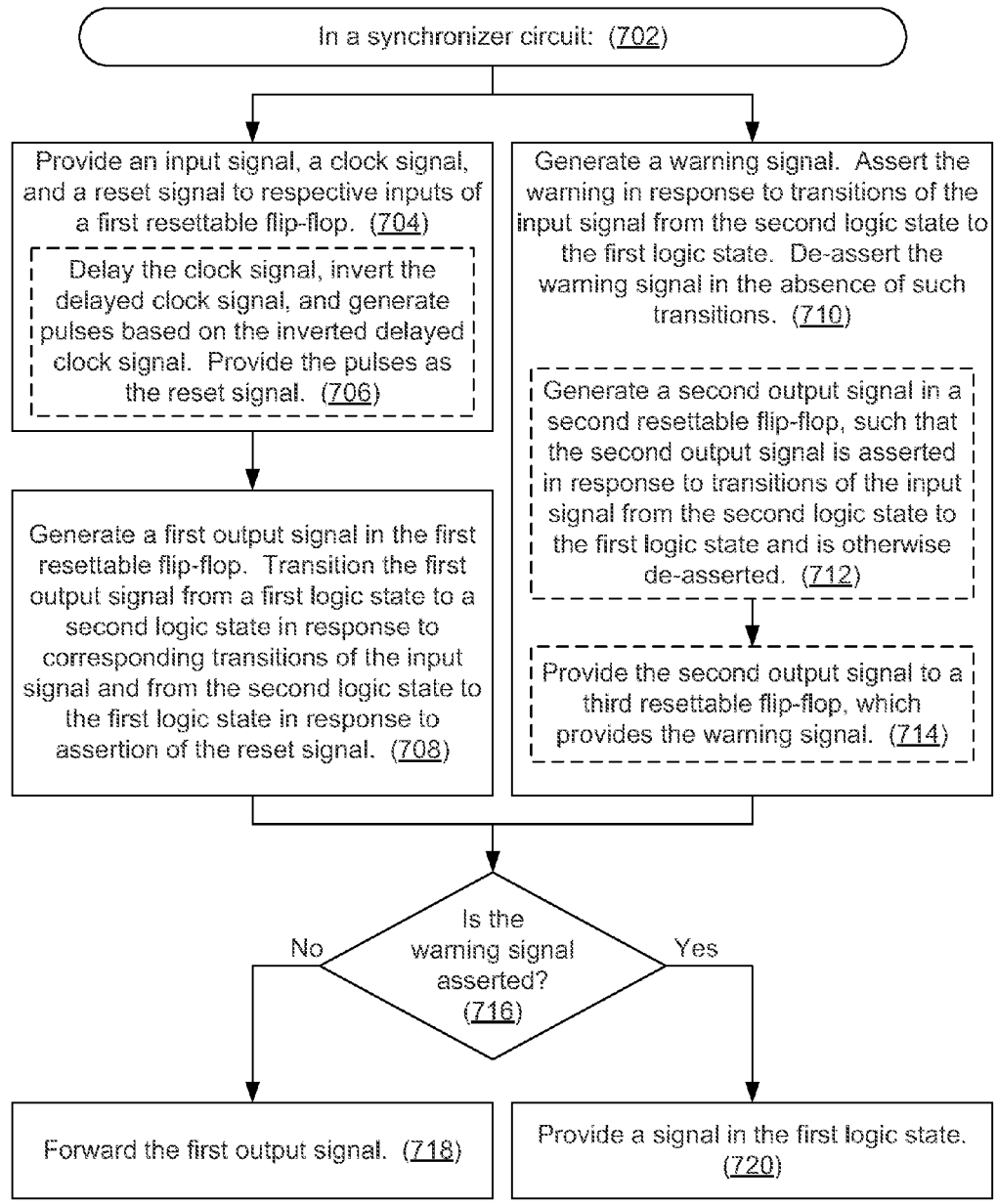
FIG. 7 is a flowchart showing a method of data synchronization in accordance with some embodiments.

FIG. 7 is a flowchart showing a method 700 of data synchronization in accordance with some embodiments. The method 700 is performed (702) in a synchronizer circuit (e.g., the synchronizer circuit 400, FIG. 4, or 600, FIG. 6).

An input signal (e.g., transmit data 202), a clock signal (e.g., receive clock 204), and a reset signal (e.g., pulses 216) are provided (704) to respective inputs of a first resettable flip-flop (e.g., first resettable flip-flop 218-1). In some embodiments, the clock signal is delayed (706) (e.g., by delay line 206), the delayed clock signal (e.g., delayed receive clock 208) is inverted (e.g., by inverter 210), and pulses (e.g., pulses 216) are generated (e.g., by pulse generator 214) based on the inverted, delayed clock signal (e.g., delayed, inverted receive clock 212). (Because the inverted, delayed clock signal is based on the clock signal, the pulses thus ultimately are based on the clock signal.) The pulses are provided (706) as the reset signal.

A first output signal is generated (708) in the first resettable flip-flop (e.g., first resettable flip-flop 218-1). The first output signal transitions from a first logic state to a second logic state in response to corresponding transitions of the input signal and from the second logic state to the first logic state in response to assertion of the reset signal. In some embodiments, the first logic state is a logic-low state (i.e., '0') and the second logic state is a logic-high state (i.e., '1'). Alternatively, the first logic state is a logic-high state (i.e., '1') and the second logic state is a logic-low state (i.e., '0').

A warning signal (e.g., warning signal 408) is generated (710). The warning is asserted in response to transitions of the input signal from the second logic state to the first logic state. The warning signal is de-asserted in the absence of such transitions.

In some embodiments, generating (710) the warning signal includes generating (712) a second output signal in a second resettable flip-flop (e.g., second resettable flip-flop 218-2), such that the second output signal is asserted in response to transitions of the input signal from the second logic state to the first logic state and is otherwise de-asserted. The second output signal is provided (714) to a third resettable flip-flop (e.g., third resettable flip-flop 218-3), which provides the warning signal.

For example, to generate the warning signal, the input signal is inverted (e.g., by inverter 404). The inverted input signal (e.g., inverted input signal 406) is provided to a clock input of the second resettable flip-flop (e.g., second resettable flip-flop 218-2). A signal fixed in the second logic state is provided to a data input of the second resettable flip-flop. For example, the data input of the second resettable flip-flop is connected to VDD. The delayed clock signal (e.g., delayed receive clock 208) is provided to a reset input of the second resettable flip-flop. A second output signal generated by the second resettable flip-flop is provided to a data input of the third resettable flip-flop (e.g., third resettable flip-flop 218-3). The clock signal is provided to a clock input of the third resettable flip-flop. The reset signal is provided to a reset input of the third resettable flip-flop. The third resettable flip-flop generates the warning signal (e.g., warning signal 408).

If the warning signal is not asserted (716—No), the first output signal is forwarded (718) (e.g., to a D flip-flop). For example, the AND gate 410 forwards the first output signal to the D flip-flop 418-1 when the warning signal 408 is not asserted.

If the warning signal is asserted (716—Yes), a signal is provided (720) in the first logic state. For example, the AND gate 410 provides a '0' to the D flip-flop 418-1 in response to assertion of the warning signal 408.

In some embodiments, a D flip-flop (e.g., D flip-flop 418-1) that receives the first output signal and the signal in the first logic state forwards these signals (e.g., as aligned data 420) to an additional stage (e.g., stage 602-2), which may forward its output to an additional stage (e.g., stage 602-3) in turn.

While the method 700 includes a number of operations that appear to occur in a specific order, it should be apparent that the method 700 can include more or fewer operations, which can be executed serially or in parallel. An order of two or more operations may be changed, performance of two or more operations may overlap, and two or more operations may be combined into a single operation. For example, all of the operations of the method 700 may be performed in parallel in an on-going basis.

The foregoing description, for purpose of explanation, has been described with reference to specific embodiments. However, the illustrative discussions above are not intended to be exhaustive or to limit all embodiments to the precise forms disclosed. Many modifications and variations are possible in view of the above teachings. The disclosed embodiments were chosen and described to best explain the underlying principles and their practical applications, to thereby enable others skilled in the art to best implement various embodiments with various modifications as are suited to the particular use contemplated.

What is claimed is:

1. A synchronizer circuit, comprising:
    a first resettable flip-flop comprising a first data input to receive an input signal, a first reset input to receive a reset signal, and a first data output to provide a first output signal, wherein the first resettable flip-flop is to produce transitions of the first output signal from a first logic state to a second logic state in response to corresponding transitions of the input signal and is to produce transitions in the first output signal from the second logic state to the first logic state in response to assertion of the reset signal;
    a detector circuit to assert a warning signal in response to transitions of the input signal from the second logic state to the first logic state; and
    a logic gate to forward the first output signal when the warning signal is de-asserted and to provide a signal in the first logic state in response to assertion of the warning signal.

2. The synchronizer circuit of claim 1, wherein:
    the detector circuit comprises second and third resettable flip-flops;
    the second and third resettable flip-flops each comprise a respective data input, a respective reset input, and a respective data output;
    the data output of the second resettable flip-flop is coupled to the data input of the third resettable flip-flop; and
    the data outputs of the second and third resettable flip-flops are to provide respective second and third asserted output signals in response to transitions of the input signal from the second logic state to the first logic state and otherwise to provide respective second and third de-asserted output signals.

3. The synchronizer circuit of claim 1, wherein the first resettable flip-flop further comprises a first clock input to receive a clock signal, the synchronizer circuit further comprising:
    a delay line to delay the clock signal;
    a first inverter, coupled to the delay line, to invert the delayed clock signal; and
    a pulse generator, coupled between the inverter and the first reset input, to generate pulses based on the inverted delayed clock signal and to provide the pulses to the first reset input as the reset signal.

4. The synchronizer circuit of claim 3, wherein the detector circuit comprises:
    a second inverter to invert the input signal; and
    a second resettable flip-flop comprising a second data input to receive a signal fixed in the second logic state, a second clock input to receive the inverted input signal from the second inverter, a second reset input to receive the delayed clock signal from the delay line, and a second data output.

5. The synchronizer circuit of claim 4, wherein:
    the first logic state is a logic-low state;
    the second logic state is a logic-high state; and
    the second data input is connected to a power supply.

6. The synchronizer circuit of claim 4, wherein the detector circuit further comprises a third resettable flip-flop comprising a third data input coupled to the second data output, a third clock input to receive the clock signal; a third reset input to receive the reset signal, and a third data output to provide the warning signal.

7. The synchronizer circuit of claim 6, further comprising:
    a first D flip-flop coupled to an output of the logic gate;
    a fourth resettable flip-flop comprising a fourth data input coupled to an output of the first D flip-flop, a fourth clock input to receive the clock signal, a fourth reset input to receive the reset signal, and a fourth data output; and
a second D flip-flop coupled to the fourth data output.

8. The synchronizer circuit of claim 1, wherein the logic gate comprises an AND gate, the AND gate comprising:
a first input to receive the warning signal from the detector circuit; and
a second input to receive the first output signal from the first resettable flip-flop.

9. The synchronizer circuit of claim 8, wherein the first input of the AND gate is an inverting input to invert the warning signal.

10. The synchronizer circuit of claim 1, further comprising a D flip-flop coupled to an output of the logic gate.

11. The synchronizer circuit of claim 10, wherein:
the first resettable flip-flop, detector circuit, logic gate, and D flip-flop are situated in a first stage of the synchronizer circuit;
the D flip-flop provides an output signal of the first stage; and
the synchronizer circuit further comprises one or more additional stages, each comprising a resettable flip-flop in series with a D flip-flop, wherein the resettable flip-flop of each respective additional stage receives an output signal of a previous stage and the D flip-flop of each respective additional stage provides an output signal of the respective additional stage.

12. A method of data synchronization, comprising:
providing an input signal and a reset signal to respective inputs of a first resettable flip-flop;
generating a first output signal in the first resettable flip-flop, wherein the first output signal transitions from a first logic state to a second logic state in response to corresponding transitions of the input signal and transitions from the second logic state to the first logic state in response to assertion of the reset signal;
asserting a warning signal in response to transitions of the input signal from the second logic state to the first logic state; and
in a logic gate, forwarding the first output signal when the warning signal is de-asserted and providing a signal in the first logic state in response to assertion of the warning signal.

13. The method of claim 12, wherein asserting the warning signal comprises:
asserting a second output signal generated by a second resettable flip-flop in response to transitions of the input signal from the second logic state to the first logic state, wherein the second output signal is otherwise de-asserted; and
providing the second output signal to a third resettable flip-flop,
wherein the third resettable flip-flop provides the warning signal.

14. The method of claim 12, further comprising:
providing a clock signal to a clock input of the first resettable flip-flop;
delaying the clock signal;
inverting the delayed clock signal;
generating pulses based on the inverted delayed clock signal; and
providing the pulses to the first resettable flip-flop as the reset signal.

15. The method of claim 14, further comprising:
inverting the input signal; and
providing a signal fixed in the second logic state to a data input of a second resettable flip-flop, the inverted input signal to a clock input of the second resettable flip-flop, and the delayed clock signal to a reset input of the second resettable flip-flop.

16. The method of claim 15, further comprising:
providing a second output signal generated by the second resettable flip-flop to a data input of a third resettable flip-flop, the clock signal to a clock input of the third resettable flip-flop, and the reset signal to a reset input of the third resettable flip-flop; and
generating the warning signal in the third resettable flip-flop.

17. The method of claim 12, wherein:
forwarding the first output signal when the warning signal is de-asserted comprises forwarding the first output signal to a D flip-flop; and
providing a signal in the first logic state in response to assertion of the warning signal comprises providing the signal in the first logic state to the D flip-flop.

18. A synchronizer circuit, comprising:
means for generating an output signal that transitions from a first logic state to a second logic state in response to corresponding transitions of an input signal and transitions from the second logic state to the first logic state in response to assertion of a reset signal;
means for asserting a warning signal in response to transitions of the input signal from the second logic state to the first logic state; and
means for forwarding the output signal when the warning signal is de-asserted and providing a signal in the first logic state in response to assertion of the warning signal.

19. The synchronizer circuit of claim 18, wherein the reset signal comprises pulses, the synchronizer circuit further comprising means for generating the pulses in accordance with a clock signal.

20. The synchronizer circuit of claim 18, further comprising means for sampling the output signal and the signal in the first logic state.

* * * * *